US009256015B2

(12) United States Patent
Umemoto et al.

(10) Patent No.: US 9,256,015 B2
(45) Date of Patent: Feb. 9, 2016

(54) METHOD AND SYSTEM FOR MANUFACTURING OPTICAL DISPLAY PANEL

(71) Applicant: NITTO DENKO CORPORATION, Ibaraki-shi, Osaka (JP)

(72) Inventors: Seiji Umemoto, Ibaraki (JP); Kouji Kimura, Ibaraki (JP); Takuya Nakazono, Ibaraki (JP); Kazuya Hada, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 139 days.

(21) Appl. No.: 13/960,891

(22) Filed: Aug. 7, 2013

(65) Prior Publication Data

US 2014/0041798 A1 Feb. 13, 2014

(30) Foreign Application Priority Data

Aug. 10, 2012 (JP) ................. 2012-178854

(51) Int. Cl.
*B29C 65/50* (2006.01)
*B32B 37/26* (2006.01)
(Continued)

(52) U.S. Cl.
CPC ............ *G02B 5/3025* (2013.01); *B32B 37/18* (2013.01); *B32B 38/18* (2013.01); *B65H 39/16* (2013.01); *G02F 1/1303* (2013.01); *H01L 51/003* (2013.01); *H01L 51/56* (2013.01); (Continued)

(58) Field of Classification Search
CPC ................ G02B 5/3025; B65H 39/16; B65H 2301/51122; B65H 2301/5162; B65H 2515/842; B65H 2801/61; B32B 7/06; B32B 31/12; B32B 37/18; B32B 37/26; B32B 38/18; H01L 51/003; H01L 51/56; G02F 1/1303; G02F 1/133528; G02F 2202/28; Y10T 156/1705; B29C 65/4825; B29C 65/5057; B29C 65/7861; B29C 65/7891; B29C 66/45; B29C 66/71; B29C 66/7338; B29C 66/73413; B29C 2793/0081; B29L 2031/3475; B29K 2029/04
USPC .......................................... 156/247, 249, 289
See application file for complete search history.

(56) References Cited

U.S. PATENT DOCUMENTS

2008/0018831 A1* 1/2008 Yano et al. ...................... 349/96
2009/0199950 A1 8/2009 Kitada et al.
(Continued)

FOREIGN PATENT DOCUMENTS

JP 4361103 B2 11/2009
JP 4503693 B1 7/2010

*Primary Examiner* — Sing P Chan
(74) *Attorney, Agent, or Firm* — Westerman, Hattori, Daniels & Adrian, LLP

(57) ABSTRACT

Manufacturing method is for manufacturing an optical display panel including an optical cell and a pressure-sensitive adhesive layer-carrying optical film provided thereon with the pressure-sensitive adhesive layer interposed therebetween, which includes the steps of unwinding a multilayer optical film from a roll, feeding the multilayer optical film, feeding an optical cell, peeling off the optical film from a carrier film, and bonding the optical film to one side of the optical cell with a pressure-sensitive adhesive interposed therebetween, wherein the longitudinal length (L) of the carrier film between a position at which the multilayer optical film begins to be unwound in the film feeding step and a position at which peeling is started in the peeling step is 15 times or more the width (W) of the carrier film.

9 Claims, 5 Drawing Sheets

(51) Int. Cl.
  *B32B 38/10* (2006.01)
  *B32B 43/00* (2006.01)
  *G02B 5/30* (2006.01)
  *H01L 51/56* (2006.01)
  *G02F 1/13* (2006.01)
  *H01L 51/00* (2006.01)
  *B32B 37/18* (2006.01)
  *B32B 38/18* (2006.01)
  *B65H 39/16* (2006.01)
  *G02F 1/1335* (2006.01)
  *B29C 65/48* (2006.01)
  *B29C 65/78* (2006.01)
  *B29C 65/00* (2006.01)
  *B29L 31/34* (2006.01)

(52) U.S. Cl.
  CPC ......... *B29C65/4825* (2013.01); *B29C 65/5057* (2013.01); *B29C 65/7861* (2013.01); *B29C 65/7891* (2013.01); *B29C 66/1122* (2013.01); *B29C 66/45* (2013.01); *B29C 66/71* (2013.01); *B29C 66/7338* (2013.01); *B29C 66/83221* (2013.01); *B29C 66/83413* (2013.01); *B29C 2793/0081* (2013.01); *B29L 2031/3475* (2013.01); *B32B 2457/202* (2013.01); *B65H 2301/5162* (2013.01); *B65H 2301/51122* (2013.01); *B65H 2515/842* (2013.01); *B65H 2801/61* (2013.01); *G02F 1/133528* (2013.01); *G02F 2202/28* (2013.01); *Y10T 156/1705* (2015.01)

(56) References Cited

U.S. PATENT DOCUMENTS

| | | |
|---|---|---|
| 2010/0276078 A1* | 11/2010 | Kitada et al. .................. 156/247 |
| 2010/0288441 A1 | 11/2010 | Kitada et al. |
| 2011/0086193 A1 | 4/2011 | Nakazono et al. |
| 2011/0284147 A1 | 11/2011 | Nakazono et al. |
| 2012/0073758 A1 | 3/2012 | Nakazono et al. |

* cited by examiner

METHOD AND SYSTEM FOR MANUFACTURING OPTICAL DISPLAY PANEL

BACKGROUND OF THE INVENTION

1. Field of the Invention

The invention relates to a method and a system for manufacturing an optical display panel including an optical cell, such as a liquid crystal cell or an electroluminescent (EL) display cell, and an optical film provided on the surface of the optical cell.

2. Description of the Related Art

One of liquid crystal display (LCD) device manufacturing steps includes a bonding step in which multilayer optical films each having a polarizing film are bonded to both sides of a liquid crystal cell, which includes a pair of substrates and a liquid crystal layer sandwiched therebetween. In general, such multilayer optical films include a polarizing film and an adhesive or pressure-sensitive adhesive layer formed on at least one surface of the polarizing film, and thus can be bonded to the surface of a liquid crystal cell with the adhesive or pressure-sensitive adhesive interposed therebetween.

A method used for bonding such optical films to a liquid crystal cell includes feeding an optical film and a liquid crystal cell in the same direction and press-bonding the optical film to the liquid crystal cell, while superposing them. Specifically, a known method includes feeding a liquid crystal cell and an optical film between a pair of rollers opposed to each other and placed perpendicular to the direction of feed of the liquid crystal cell and the optical film, such as a pair of a guide roller for feeding the liquid crystal cell and a bonding roller for press-bonding the optical film to the liquid crystal cell, while superposing them; and press-bonding the optical film to the liquid crystal cell. In this case, the pressure-sensitive adhesive layer formed on the optical film may be covered with a peelable release film, and the optical film may be bonded to the liquid crystal cell by the above step, while or after the release film is peeled off. Examples of such a liquid crystal display device manufacturing method include a piece-by-piece manufacturing method in which optical film pieces formed by previously cutting an optical film into pieces of a predetermined size are each bonded to a liquid crystal cell by the above method; and a continuous manufacturing method in which optical film pieces formed by half-cutting are continuously supplied on a carrier film and each bonded (see, for example, Japanese Patent No. 4361103).

The latter continuous manufacturing method enables a continuous process of bonding between a liquid crystal cell and an optical film and therefore is significantly advantageous in terms of mass productivity or yield as compared with the conventional piece-by-piece method. A method for continuously manufacturing a liquid crystal display device includes providing a roll of a long multilayer optical film including a long carrier film and a long pressure-sensitive adhesive-carrying optical film placed on the carrier film with the pressure-sensitive adhesive interposed therebetween, cutting the long optical film to form predetermined sized pieces of the optical film on the long carrier film, while unwinding the multilayer optical film from the roll, and feeding the carrier film so that the pieces are continuously supplied to the bonding position.

Usually, such a roll of a multilayer optical film has a width corresponding to the length of one side of a rectangular liquid crystal cell. On the other hand, the long optical film, which is part of the multilayer optical film unwound from the roll, is cut into a piece with a length corresponding to the length of another side of the liquid crystal cell, so that the resulting piece of the optical film has the size of the liquid crystal cell. The piece of the optical film obtained by cutting into a size corresponding to that of the liquid crystal cell is fed to the step of bonding to the liquid crystal cell, as it is formed on the carrier film, and bonded to the liquid crystal cell. In the bonding step, the piece of the optical film fed on the carrier film is supplied to a bonding unit while it is peeled off from the carrier film, and the piece of the optical film and the optical cell, which is sequentially fed, are placed between a pair of pressing units and pressed by the pressing units, so that the piece of the optical film is bonded to at least one side of the liquid crystal cell with the pressure-sensitive adhesive layer of the optical film interposed therebetween. Such a pair of pressing units usually includes a pair of rolls, which is configured to feed the liquid crystal cell and the piece of the optical film while pressing them and to continuously press and bond the piece of the optical film from one end of the piece to the other.

On the other hand, an EL display panel produced with an organic or inorganic EL device often has a metal back electrode usually in order to increase the quantum efficiency of the luminescence or to increase the quantity of light output from the front side by reflection. EL display devices are characterized by achieving a very high display contrast ratio, but such characteristics are achieved only in a darkroom. In a usual environment for display view, external light such as light from indoor lighting is reflected by the back electrode of an EL display device to significantly reduce the contrast ratio and the display quality. To prevent a back electrode from reflecting external light, therefore, an anti-reflection film for circular polarization is bonded to the viewer-side surface of an EL display panel. Such an anti-reflection film includes a polarizing film and a retardation film, in which their absorption and slow axes should be ideally arranged at an angle of 45°, and the retardation film should be a quarter wavelength plate to produce a retardation. To improve productivity, it is also preferable to use a continuous manufacturing method in bonding an anti-reflection film to an EL display device. However, there has not been known any application of the above continuous liquid crystal display device-manufacturing method in manufacturing an EL display device.

It is also disclosed that pieces of optical film are formed in advance on a carrier film by cutting a long optical film (having a pressure-sensitive adhesive layer) as part of a long multilayer optical film and a roll of the product including the carrier film and the pieces formed thereon is put to use (see, for example, Japanese Patent No. 4503693).

The manufacturing apparatus for use in the above continuous manufacturing method has been required to be as compact in size as possible in view of production efficiency per area. There is also an increasing demand for high-throughput, high-yield bonding between an optical film and an optical cell in such a method for continuous manufacturing of an optical display panel.

PRIOR ART DOCUMENT

Patent Document

Patent Document 1: Japanese Patent No. 4361103
Patent Document 2: Japanese Patent No. 4503693

SUMMARY OF THE INVENTION

In a conventional method for continuous manufacturing of an optical display panel, an optical film is generally fed under a high degree of control so that it can accurately travel in a straight line, for the purpose of suppressing wrinkles and bubbles in the process of bonding an optical film to a liquid crystal cell. For this purpose, a large number of devices are needed to control the travel of the film.

Also in such a conventional method for continuous manufacturing of an optical display panel, productivity can increase with increasing length of the long film wound into a roll. This is obvious in view of a reduction in losses caused by the replacement of the roll.

However, as the length of the long film increases, namely, as the diameter of the roll increases, displacement of windings becomes more likely to occur due to vibration during transportation or other causes. Also in the production of a roll of long film, the long film must be wound at a high degree of uniformity so that no displacement of windings will occur in the roll. Such a long film includes a pressure-sensitive adhesive layer-carrying long optical film and a carrier film that protects the pressure-sensitive adhesive. If necessary, such an optical film may include a polarizing film.

Such a polarizing film is generally produced by adsorbing a dichroic material to a polyvinyl alcohol (PVA) film and stretching the film. Usually, such a polarizing film exhibits absorption dichroism for electromagnetic waves including visible light and has an absorption axis parallel to the stretching axis. The PVA film used as a base material for the polarizing film has very high hydrophilicity and, in general, is easily affected by moisture or heat. Thus, a roll of such a material can easily undergo displacement of windings (which means as a synonym of winding deviation or winding dislocation.) because it expands or contracts when it absorbs moisture or it is dried or heated. In general, displacement of windings often occurs locally at and around a layer of a certain part of a roll, and this displacement of windings can significantly displace other windings of the film. When a long film is unwound from a roll with displaced windings in a conventional continuous manufacturing method, the displacement of windings can degrade the straight travel of the film, so that bonding misalignment or bubbles can easily occur at or around the displaced winding, which may cause defects.

To deal with this winding displacement-induced problem with bonding, complicated alignment will be necessary between an optical film and an optical cell, which can increase tact time and reduce productivity.

In addition, the friction between the front end of peeling means and the carrier film is high, so that the tension on the long film can significantly vary in the transverse direction when the roll has displaced windings. This can cause a problem in that wrinkles or bubbles can easily occur during the bonding to the optical cell. These problems can also occur when an optical film as part of a long film is cut in advance into pieces of a predetermined length and a roll obtained by winding the long film with the cut pieces is used. Japanese Patent No. 4361103 or Japanese Patent No. 4503693 does not disclose anything about these problems.

Thus, the invention has been made in view of these circumstances, and an object of the invention is to provide an optical display panel manufacturing method and an optical display panel manufacturing system that make it possible to successfully bond an optical film to an optical cell even when a roll having displaced windings is used in an optical display panel manufacturing method including unwinding a long multilayer optical film from a roll, cutting an optical film as part of the multilayer optical film into pieces of a size corresponding to the size of an optical cell, and bonding the cut piece of optical film to the optical cell while continuously feeding the cut piece of optical film using a carrier film.

As a result of earnest study, the inventors have found that the problems can be solved when the length of a carrier film between the unwinding position at which it begins to be unwound from a roll and the bonding position (peeling position) is 15 times or more the width of the roll.

The invention is directed to a method for manufacturing an optical display panel including an optical cell and a pressure-sensitive adhesive layer-carrying optical film provided on the optical cell with the pressure-sensitive adhesive layer interposed therebetween, the method including:

an unwinding step including providing a roll of a multilayer optical film including the optical film and a long carrier film placed on the optical film with the pressure-sensitive adhesive layer interposed therebetween and unwinding the multilayer optical film from the roll;

a film feeding step including feeding the multilayer optical film being unwound from the roll in the unwinding step;

an optical cell feeding step including feeding the optical cell;

a peeling step including peeling off the optical film from the carrier film by inwardly folding back the carrier film fed by the film feeding step; and a bonding step including bonding the optical film, which is peeled off from the carrier film in the peeling step, to one side of the optical cell with the pressure-sensitive adhesive interposed therebetween while feeding the optical cell, wherein the longitudinal length (L) of the carrier film between an unwinding position at which the multilayer optical film begins to be unwound in the film feeding step and a peeling position at which peeling is started in the peeling step is 15 times or more the width (W) of the carrier film.

According to this feature, the longitudinal length (L) of the carrier film between the unwinding position at which the multilayer optical film begins to be unwound and the peeling position is 15 times or more the width (W) of the carrier film. This makes it possible to effectively reduce bonding misalignment- or bubble-induced defects caused by the influence of displaced windings in a roll of a long multilayer optical film, so that optical display panels can be manufactured with high throughput and high yield.

In an embodiment of the invention, the method further including:

a second unwinding step including providing a second roll of a second multilayer optical film comprising a second optical film having a pressure-sensitive adhesive layer and a second long carrier film placed on the second optical film with the pressure-sensitive adhesive layer interposed therebetween and unwinding the second multilayer optical film from the second roll;

a second film feeding step including feeding the second multilayer optical film being unwound from the second roll in the second unwinding step;

an optical cell feeding step including feeding the optical cell;

a second peeling step including peeling off the second optical film from the second carrier film by inwardly folding back the second carrier film fed by the second film feeding step; and a second bonding step including bonding the second optical film, which is peeled off from the second carrier film in the second peeling step, to another side of the optical cell with the pressure-sensitive adhesive interposed therebetween while feeding the optical cell, wherein the longitudinal length (L) of the second carrier film between an unwinding position at which the second multilayer optical film begins to be unwound in the second film feeding step and a peeling position at which peeling is started in the second peeling step is 15 times or more the width (W) of the second carrier film.

This feature is preferable in that the optical film can also be bonded to the other side of the optical cell.

In an embodiment of the invention, the optical film is a polarizing film. This feature is preferable in that a roll of a multilayer optical film including a polarizing film can be advantageously used even though the polarizing film can easily undergo displacement of windings.

In an embodiment of the invention, the polarizing film has an absorption axis in a direction perpendicular to its longitudinal direction.

In an embodiment of the invention, the polarizing film has an absorption axis in a direction parallel to its longitudinal direction.

In an embodiment of the invention, the optical cell is an electroluminescent cell including an organic electroluminescent cell or an inorganic electroluminescent cell, and the multilayer optical film includes a polarizing film having an absorption axis parallel or perpendicular to its longitudinal direction, a retardation film having a slow axis at an angle in the range of 35° to 55° with respect to the absorption axis of the polarizing film and having a retardation in the range of 110 nm to 170 nm at a wavelength of 550 nm, and an adhesive or a pressure-sensitive adhesive, wherein the polarizing film, the retardation film, and the adhesive or pressure-sensitive adhesive are arranged in this order.

The invention is also directed to a system for manufacturing an optical display panel including an optical cell and a pressure-sensitive adhesive layer-carrying optical film provided on the optical cell with the pressure-sensitive adhesive layer interposed therebetween, the system including:

an unwinding unit including providing a roll of a multilayer optical film including the optical film and a long carrier film placed on the optical film with the pressure-sensitive adhesive layer interposed therebetween and unwinding the multilayer optical film from the roll;

a film feeding unit including feeding the multilayer optical film being unwound from the roll in the unwinding unit;

an optical cell feeding unit including feeding the optical cell;

a peeling unit including peeling off the optical film from the carrier film by inwardly folding back the carrier film fed by the film feeding unit; and a bonding unit including bonding the optical film, which is peeled off from the carrier film in the peeling unit, to one side of the optical cell with the pressure-sensitive adhesive interposed therebetween while feeding the optical cell, wherein the longitudinal length (L) of the carrier film between an unwinding position at which the multilayer optical film begins to be unwound in the film feeding unit and a peeling position at which peeling is started in the peeling unit is 15 times or more the width (W) of the carrier film.

According to this feature, the longitudinal length (L) of the carrier film between the unwinding position at which the multilayer optical film begins to be unwound and the peeling position is 15 times or more the width (W) of the carrier film. This makes it possible to effectively reduce bonding misalignment- or bubble-induced defects caused by the influence of displaced windings in a roll of a long multilayer optical film, so that optical display panels can be manufactured with high throughput and high yield.

In an embodiment of the invention, the system further including:

a second unwinding unit including providing a second roll of a second multilayer optical film including a second optical film having a pressure-sensitive adhesive layer and a second long carrier film placed on the second optical film with the pressure-sensitive adhesive layer interposed therebetween and unwinding the second multilayer optical film from the second roll;

a second film feeding unit including feeding the second multilayer optical film being unwound from the second roll in the second unwinding unit;

an optical cell feeding unit including feeding the optical cell;

a second peeling unit including peeling off the second optical film from the second carrier film by inwardly folding back the second carrier film fed by the second film feeding unit; and a second bonding unit including bonding the second optical film, which is peeled off from the second carrier film in the second peeling unit, to another side of the optical cell with the pressure-sensitive adhesive interposed therebetween while feeding the optical cell, wherein the longitudinal length (L) of the second carrier film between an unwinding position at which the second multilayer optical film begins to be unwound in the second film feeding unit and a peeling position at which peeling is started in the second peeling unit is 15 times or more the width (W) of the second carrier film.

This feature is preferable in that the optical film can also be bonded to the other side of the optical cell.

In an embodiment of the invention, the front end of the peeling unit preferably has a semicircular cross-sectional shape. The semicircular cross-sectional shape enables the carrier film to smoothly follow the front end of the peeling unit when the carrier film is folded back, so that the carrier film can slide on the front end of the peeling unit while being fed.

In an embodiment of the invention, the front end of the peeling unit preferably has a semicircular cross-sectional shape with a radius of 4 mm (8 mm in diameter) or less, more preferably with a radius of 2.5 mm (5 mm in diameter) or less. The radius should be selected in order to reliably peeling off the optical film from the carrier film. Too small a radius of the semicircular front end of the peeling unit can cause breakage of the carrier film. Thus, the radius of the semicircle is preferably 0.5 mm or more, more preferably 1 mm or more.

The interior angle of the folding back at the front end of the peeling means may be 45° or less, preferably 30° or less, more preferably 15° or less. This is for reliably peeling off the film and avoiding interference between the display panel feeding line and the carrier film feeding line.

<Mechanism of the Invention>

When the carrier film is folded back at an angle of 45° or less at the front end of the peeling unit, the tension on the carrier film can produce a strong frictional force between the carrier film and the front end of the peeling unit. Therefore, it can be assumed that the transverse position of the carrier film is almost fixed when it passes through the front end of the peeling unit. It is preferred that a long multilayer optical film should be unwound from an ideal roll and fed in an ideal state. Actually, however, it is very difficult to obtain a completely uniformly wound material for various reasons. Because of the frictional force, it is almost impossible to shift the transverse position of the carrier film passing through the front end of the peeling unit, and therefore, if the roll has displaced windings, the transverse tension on the carrier film can significantly change with respect to the film feed direction, and the feed angle can also deviate.

Because the carrier film is used to feed the optical film, such a significant change in the transverse tension on the carrier film can directly affect the feed to cause bubbles, wrinkles, or bonding misalignment in the process of bonding the optical film piece to the optical cell. Such an unbalanced tension can also cause the carrier film to wrinkle during the feeding and thus cause the optical film to wrinkle. This is because an end of the film where the tension is particularly low can easily move due to a reduced frictional force at the front end of the peeling unit.

When feed rolls are provided to feed the carrier film, the relative positions of the feed rolls and the film being fed through the rotation of the shafts are changed. Such movement of the film can gradually cancel the unbalance in tension. At the peeling unit, however, such a cancelling effect is not well produced because of the friction at the front end of the peeling unit.

In addition, the change in the carrier film feed angle can cause a change in the angle at the position where the optical film is bonded, which may cause misalignment in the process of bonding to the optical cell and may also cause an increase in tact time and a decrease in production efficiency because it will be necessary to modulate the position and angle of the optical cell.

Usually, the film is fed through feed rolls placed in the feed route. In this process, rotating feed rolls always provide new surfaces to come into contact with the film regardless of whether the rolls are driving rolls or free rolls. Thus, when the state of feeding of the long film changes because of displaced windings in the roll, the change will be transmitted to the front end of the peeling unit without being influenced by the feed rolls and can affect the quality of the bonding. It has been found that the influence of displaced windings in the roll increases with increasing width (W) of the long film. Specifically, when the feed angle deviates from a specific angle due to displaced windings in the roll, the difference between the tensions on both ends of the film can increase with increasing width of the film, and the absolute amount of displacement at the front end of the peeling unit can also increase.

It has also been found that the influence of displaced winding in the roll can decrease as the length of the carrier film being fed between the unwinding position (unwinding unit) at which the roll is unwound and the bonding position (bonding unit) increases, more specifically, as the length (L) of the carrier film between the unwinding position at which the roll is unwound and the front end of the peeling unit increases. This is because the deviation of the carrier film feed angle, which is caused by displaced windings in the roll, decreases as the L increases. In addition, the carrier film and the optical film, which are both an elastic material made of resin, can absorb strain to a certain extent. The ability to absorb strain increases as the L increases.

Thus, the inventors have found that when the value of L/W is 15 or more, successful bonding is possible. If the L/W is less than 15, the influence of displaced windings in the roll will be significant so that the bonding quality can decrease.

The prior art does not disclose or suggest such an L/W value at all. To successfully bond an optical film to an optical cell, the width of the carrier film may be reduced for an increase in the L/W. However, the width of the long carrier film cannot be freely changed because it is determined by the width of the rectangular optical cell product. Thus, the length of the film between the unwinding unit and the bonding unit in the manufacturing system, namely the L, should be increased. The L is uniquely determined by the design of the system for manufacturing an optical display panel. Therefore, it is important to design the length of the feed route to be 15 times or more the width of the long carrier film, which is determined by the width of the optical display panel to be produced. The system of the invention for manufacturing an optical display panel is designed and built in such a manner that the distance L of travel of the long carrier film (the travel distance from the unwinding unit to the bonding unit) is 15 times or more the width of the long carrier film depending on the size of the optical cell to be used in the manufacture.

DETAILED DESCRIPTION OF THE PREFERRED EMBODIMENTS

Figure 1A:
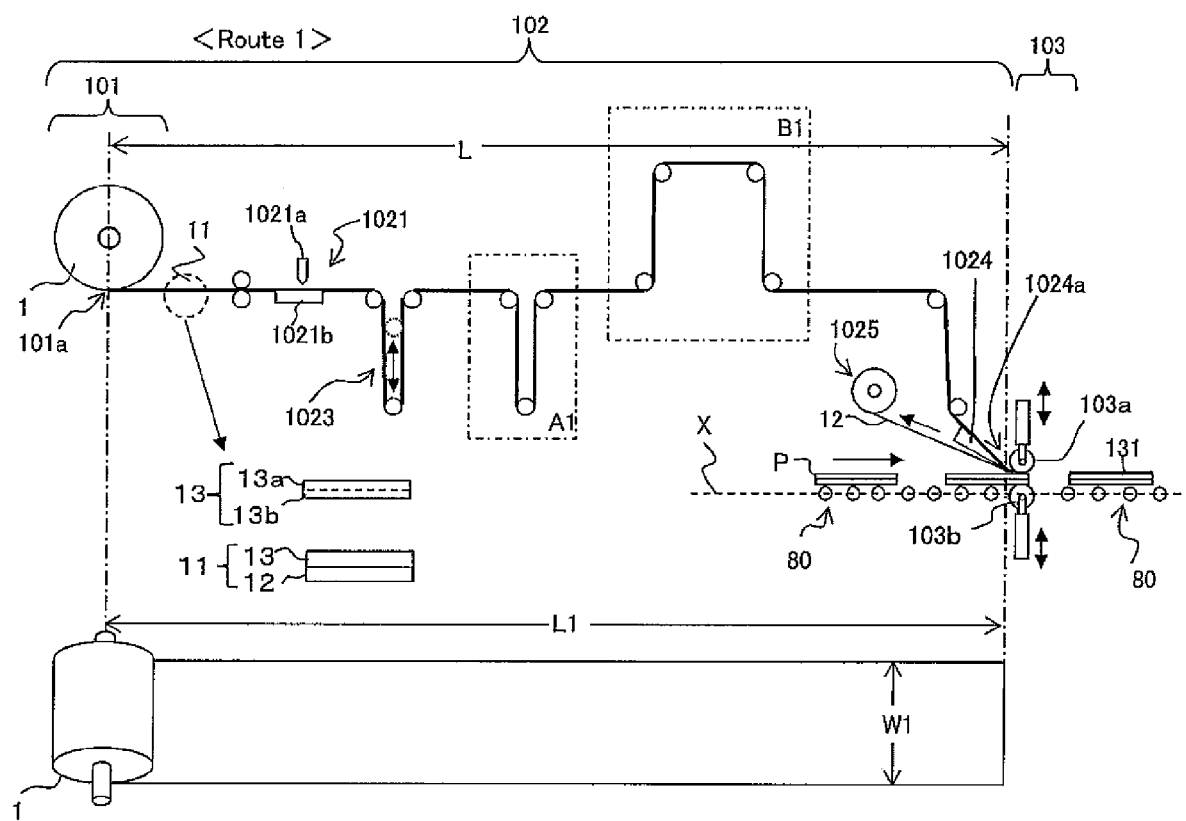
FIG. 1A is a diagram showing an example of a system of Embodiment 1 for manufacturing an optical display panel.

Hereinafter, an embodiment of the invention will be described. FIG. 1 is a diagram showing an example of an optical display panel manufacturing system according to an embodiment of the invention.

(Material Roll)

The optical film roll is a roll of a long multilayer optical film including a long optical film and having a width corresponding to the length of a pair of opposite sides of an optical cell. One mode of the long multilayer optical film is a roll of a laminate including a carrier film and a long optical film placed thereon. In another mode of the long multilayer optical film, the long optical film wound into a roll has a plurality of score lines each formed in the transverse direction.

(Optical Film)

An example of the optical film is a polarizing film. For example, the main part of a polarizing film includes a polarizer (generally about 1 to about 80 μm in thickness) and a polarizer-protecting film or films (generally about 1 to about 500 μm in thickness) formed on one or both sides of the polarizer with or without an adhesive. The polarizer usually has an absorption axis in the stretched direction. A polarizing film including a long polarizer having an absorption axis in the longitudinal direction is also called an "MD polarizing film", and a polarizing film including a long polarizer having an absorption axis in the transverse direction is also called a "TD polarizing film".

The optical film may further include any other film such as a retardation film such as a λ/4 plate or a λ/2 plate (generally 10 to 200 μm in thickness), a viewing angle compensation film, a brightness enhancement film, or a surface protecting film. For example, the multilayer optical film may have a thickness in the range of 10 μm to 500 μm.

Another example of the optical film is a linear polarization separating film. For example, the main part of a linear polarization separating film is a reflective polarizing film of a multilayer structure having a reflection axis and a transmission axis. For example, the reflective polarizing film can be obtained by alternately stacking a plurality of polymer films A and B made of two different materials and stretching them. The refractive index of only the material A is changed and increased in the stretching direction, so that birefringence is produced, in which a reflection axis is formed in the stretching direction where there is a difference in refractive index at the material A-B interface, and a transmission axis is formed in the direction (non-stretching direction) where no difference in refractive index is produced. This reflective polarizing film has a transmission axis in the longitudinal direction and a reflection axis in the transverse direction (widthwise direction). A commercially available product may be directly used as the reflective polarizing film, or a commercially available product may be subjected to secondary working (such as stretching) and then used as the reflective polarizing film. Examples of the commercially available product include DBEF (trade name) manufactured by 3M Company and APF (trade name) manufactured by 3M Company.

The pressure-sensitive adhesive may be of any type such as an acryl-based pressure-sensitive adhesive, a silicone pressure-sensitive adhesive, or a urethane pressure-sensitive adhesive. For example, the thickness of the pressure-sensitive adhesive layer is preferably in the range of 10 μm to 50 μm. The peel strength between the pressure-sensitive adhesive and the carrier film is typically, but not limited to, 0.15 (N/50 mm sample width). The peel strength can be measured according to JIS Z 0237.

(Carrier Film)

For example, the carrier film to be used may be a conventionally known film such as a plastic film (e.g., a polyethylene terephthalate-based film or a polyolefin-based film). According to conventional techniques, any appropriate film such as a film coated with an appropriate release agent such as a silicone, long-chain alkyl, or fluoride release agent, or molybdenum sulfide may also be used as needed. In general, the carrier film is also called a release film (separator film).

(Liquid Crystal Cell and Liquid Crystal Display Panel)

For example, the optical cell may be a liquid crystal cell. The liquid crystal cell includes a pair of substrates (a first substrate (viewer side) Pa and a second substrate (back side) Pb) opposed to each other and a liquid crystal layer sealed between the substrates. The liquid crystal cell to be used may be of any type. To achieve high contrast, it is preferable to use a vertical alignment (VA) mode liquid crystal cell or an in-plane switching (IPS) mode liquid crystal cell. The liquid crystal display panel (an example of the optical display panel) includes the liquid crystal cell, a polarizing film or films bonded to one or both sides of the liquid crystal cell, and optionally a driving circuit incorporated therein.

(Organic EL Cell and Organic EL Display Panel)

For example, the optical cell may also be an organic EL cell. The organic EL cell includes a pair of electrodes and an electroluminescent layer sandwiched between the electrodes. The organic EL cell to be used may be of any type, such as a top emission type, a bottom emission type, or a double emission type. The organic EL display panel (an example of the optical display panel) includes the organic EL cell, a polarizing film or films bonded to one or both sides of the organic EL cell, and optionally a driving circuit incorporated therein.

Hereinafter, a system for continuously manufacturing the optical display panel will be specifically described with reference to FIGS. 1A and 1B. This embodiment will also be described with reference to an example where the optical cell is a horizontally-long rectangular liquid crystal cell and the optical display panel is a horizontally-long rectangular liquid crystal display panel.

A first optical film roll 1 (corresponding to the first material roll) is a roll of a first long multilayer optical film 11 having a width corresponding to the long side of a liquid crystal cell P. The first long multilayer optical film 11 includes a first carrier film 12 and a first long polarizing film 13 (corresponding to the optical film) placed thereon and having an absorption axis in the longitudinal direction. In this embodiment, as shown in FIG. 1A, the first long polarizing film 13 includes a long film main part 13a and a pressure-sensitive adhesive 13b.

A second optical film roll 2 (corresponding to the second material roll) is a roll of a second long multilayer optical film 21 having a width corresponding to the short side of a liquid crystal cell P. The second long multilayer optical film 21 includes a second carrier film 22 and a second long polarizing film 23 (corresponding to the optical film) placed thereon and having an absorption axis in the longitudinal direction. In this embodiment, as shown in FIG. 1B, the second long polarizing film 23 includes a long film main part 23a and a pressure-sensitive adhesive 23b.

Figure 1B:
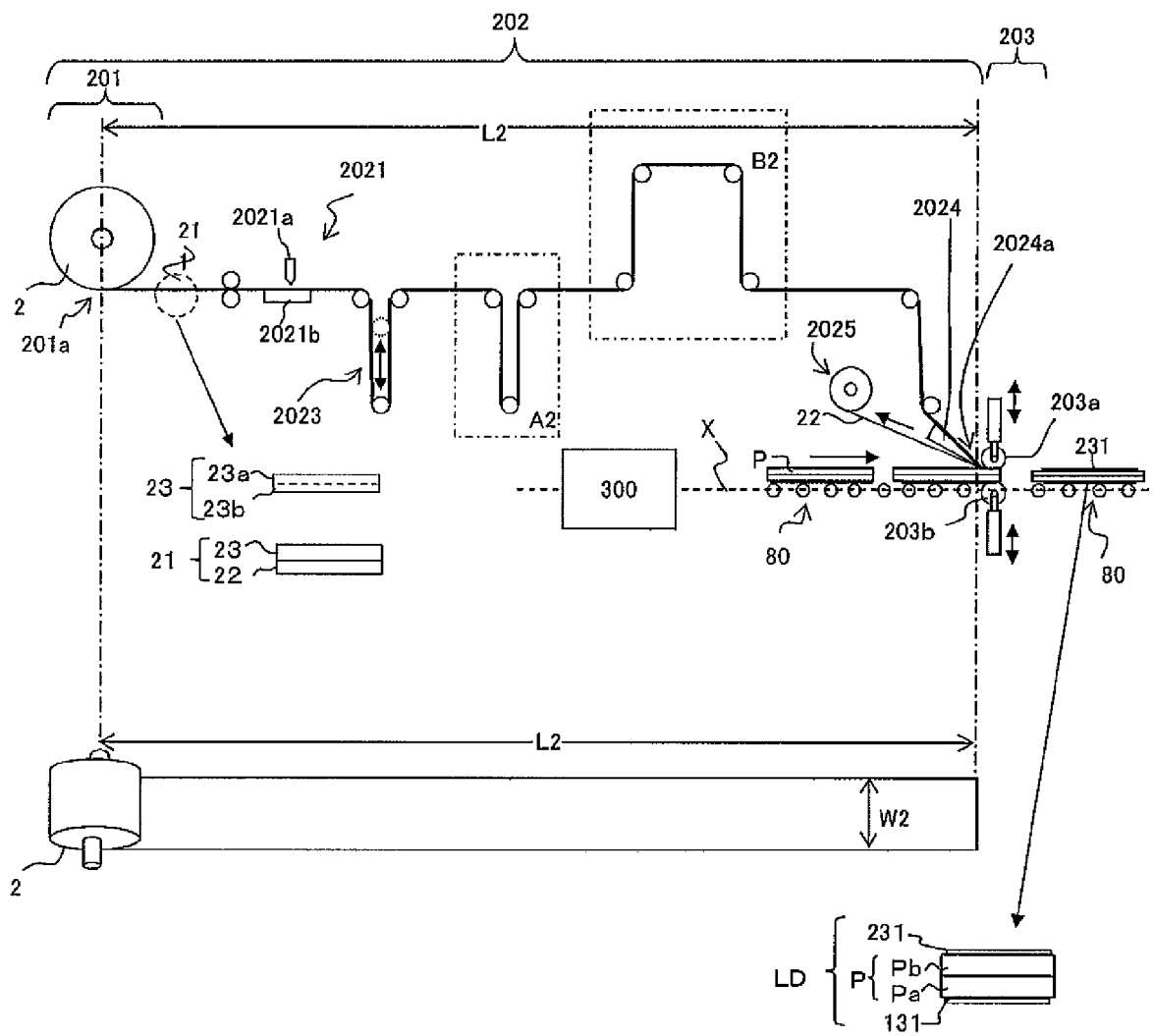
FIG. 1B is a diagram showing an example of a system of Embodiment 1 for manufacturing an optical display panel.

The system according to this embodiment for continuously manufacturing a liquid crystal display panel is designed to bond optical films to both sides of a liquid crystal cell, and includes, as shown in FIGS. 1A and 1B, a series of feed units X (corresponding to the optical cell feeding unit) for feeding a liquid crystal cell P and a liquid crystal display panel LD, a first film feeding unit 102 having a first unwinding unit 101, a first bonding unit 103, a second film feeding unit 202 having a second unwinding unit 201, and a second bonding unit 203.

(Feed Units)

The feed units X are configured to feed a liquid crystal cell P and a liquid crystal display panel LD. The feed units X include a plurality of feed rollers 80, a suction plate, and other components. Although described in detail later, the feed units X in this embodiment also include an orientation changing unit 300 between the first bonding unit 103 and the second bonding unit 203 for interchanging the directions of the long and short sides of the liquid crystal cell P relative to the direction of feed of the liquid crystal cell P and for turning the liquid crystal cell P upside down.

(First Film Feeding Unit)

The first film feeding unit 102 is configured to perform a process including cutting the first long polarizing film 13, which has a width corresponding to the long side of the liquid crystal cell P, in the transverse direction at intervals corresponding to the short side of the liquid crystal cell P to form a first polarizing film piece 131; and supplying the resulting first polarizing film piece 131 from the first optical film roll 1 to the first bonding unit 103. In this embodiment, the first film feeding unit 102 for this process includes a first unwinding unit 101, a first cutting unit 1021, a first tension control unit 1023, a first peeling unit 1024, a first take-up unit 1025, and a plurality of feed roller units A1 and B1.

The first unwinding unit 101 has an unwinding shaft, on which the first optical film roll 1 is mounted, and is configured to unwind the first long multilayer optical film 11 from the first optical film roll 1. The first unwinding unit 101 may have two unwinding shafts. This makes it possible to rapidly join a film to another film from a roll mounted on another unwinding shaft without replacing the roll 1 with new one.

The cutting unit 1021 includes cutting means 1021a and suction means 1021b and is configured to half cut the first long multilayer optical film 11 in the transverse direction at intervals corresponding to the short side of the liquid crystal cell P (namely, to cut the first long polarizing film 13 in the transverse direction without cutting the first carrier film 12). In this embodiment, the first cutting unit 1021 is configured to perform a process including cutting the first long polarizing film 13 (the film main part 13a and the pressure-sensitive adhesive 13b) in the transverse direction using the cutting means 1021a while fixing the first long multilayer optical film 11 by sucking it from the first carrier film 12 side with the suction means 1021b, so that a first polarizing film piece 131 of a size corresponding to that of the liquid crystal cell P is formed on the first carrier film 12. The cutting means 1021a may be a cutter, a laser, or a combination thereof.

The first tension control unit 1023 has the function of maintaining a tension on the first long multilayer optical film 11. In this embodiment, a non-limiting example of the first tension control unit 1023 includes dancer rolls.

The first peeling unit 1024 is configured to peel off the first polarizing film piece 131 from the first carrier film 12 by folding back the first long multilayer optical film 11 with the first carrier film 12 inside. The first peeling unit 1024 may include a wedge-shaped member, rollers, and other components.

The first take-up unit 1025 is configured to take up the first carrier film 12 from which the first polarizing film piece 131 is peeled off. The first take-up unit 1025 has a take-up shaft on which a roll for taking up the first carrier film 12 is mounted.
(First Bonding Unit)

The first bonding unit 103 is configured to perform a process including bonding the first polarizing film piece 131 (peeled off by the first peeling unit 1024), which is supplied by the first film feeding unit 102, to the back side surface Pb of the liquid crystal cell P with the pressure-sensitive adhesive 13b interposed therebetween from the long side of the liquid crystal cell P along the direction of feed of the first polarizing film piece 131 (or along the direction of the short side of the liquid crystal cell P) while feeding the liquid crystal cell P in a direction parallel to the short side of the liquid crystal cell P, which is fed by the feed units X. The first bonding unit 103 includes a pair of bonding rollers 103a and 103b, in which at least one of the bonding rollers 103a and 103b is a driving roller.

In the first film feeding unit 102, the longitudinal length L1 of the first carrier film 12 between the unwinding position 101a (in the first unwinding unit 101) at which the first multilayer optical film 11 begins to be unwound and the peeling position 1024a at which peeling is started in the first peeling unit 1024 is 15 times or more the width W1 of the first carrier film 12. In this embodiment, the peeling position 1024a corresponds to the position at which the first carrier film 12 is folded back at the front end of the first peeling unit 1024. The longitudinal length L1 is the actual length of the film between the unwinding position 101a and the peeling position 1024a in the first peeling unit 1024. Therefore, the length L1 corresponds to the feed route including the feed roller units A1 and B1 as shown in the upper part of FIG. 1A although the lower part of FIG. 1A schematically shows the carrier film in planar view.
(Second Film Feeding Unit)

The second film feeding unit 202 is configured to perform a process including cutting the second long multilayer optical film 21, which has a width corresponding to the short side of the liquid crystal cell P, in the transverse direction at intervals corresponding to the long side of the liquid crystal cell P to form a second polarizing film piece 231; and supplying the resulting second polarizing film piece 231 from the second optical film roll 2 to the second bonding unit 203. In this embodiment, the second film feeding unit 202 for this process includes a second unwinding unit 201, a second cutting unit 2021, a second tension control unit 2023, a second peeling unit 2024, a second take-up unit 2025, and a plurality of feed roller units A2 and B2. The second unwinding unit 201, the second cutting unit 2021, the second tension control unit 2023, the second peeling unit 2024, and the second take-up unit 2025 have the same configuration and function as the first unwinding unit 101, the first cutting unit 1021, the first tension control unit 1023, the first peeling unit 1024, and the first take-up unit 1025, respectively.
(Second Bonding Unit)

The second bonding unit 203 is configured to perform a process including bonding the second polarizing film piece 231 (peeled off by the second peeling unit 2024), which is supplied by the second film feeding unit 202, to the viewer-side surface Pa of the liquid crystal cell P with the pressure-sensitive adhesive 23b interposed therebetween from the short side of the liquid crystal cell P along the direction of feed of the second polarizing film piece 231 (or along the direction of the long side of the liquid crystal cell P) while feeding the liquid crystal cell P in a direction parallel to the long side of the liquid crystal cell P, which is fed by the feed units X. The second bonding unit 203 includes a pair of bonding rollers 203a and 203b, in which at least one of the bonding rollers 203a and 203b is a driving roller.

In the second film feeding unit 202, the longitudinal length L2 of the second carrier film 22 between the unwinding position 201a (in the second unwinding unit 201) at which the second multilayer optical film 21 begins to be unwound and the peeling position 2024a at which peeling is started in the second peeling unit 2024 is 15 times or more the width W2 of the second carrier film 22. In this embodiment, the peeling position 2024a corresponds to the position at which the second carrier film 22 is folded back at the front end of the second peeling unit 2024. The longitudinal length L2 is the actual length of the film between the unwinding position 201a and the peeling position 2024a in the second peeling unit 2024. Therefore, the length L2 corresponds to the feed route including the feed roller units A2 and B2 as shown in the upper part of FIG. 1B although the lower part of FIG. 1B schematically shows the carrier film in planar view.
(Orientation Changing Unit)

In this embodiment, the feed units X include an orientation changing unit 300 between the first bonding unit 103 and the second bonding unit 203. The orientation changing unit 300 is configured to interchange the directions of the long and short sides of the liquid crystal cell P relative to the direction of feed of the liquid crystal cell P and to turn the liquid crystal cell P upside down. In this embodiment, the orientation changing unit 300 includes a rotation unit for horizontally rotating the liquid crystal cell P by 90° while sucking it; and a turnover unit for turning the liquid crystal cell P upside down by sucking the liquid crystal cell P and rotating it around an in-cell-plane rotation axis parallel or perpendicular to the direction of feed of the liquid crystal cell P. When the orientation changing unit 300 is provided, the first and second polarizing film pieces can be bonded to the liquid crystal cell P in directions perpendicular to each other without arranging the first polarizing film 11 feeding line and the second polarizing film 21 feeding line perpendicular to each other, so that the installation space for the system can be reduced.
(Method for Continuously Manufacturing Optical Display Panel)

The method for continuously manufacturing an optical display panel according to Embodiment 1 is a method for manufacturing an optical display panel including an optical cell and a pressure-sensitive adhesive layer-carrying optical film provided on the optical cell with the pressure-sensitive adhesive layer interposed therebetween, the method includes: an unwinding step including providing a roll of a multilayer optical film including the optical film and a long carrier film placed on the optical film with the pressure-sensitive adhesive layer interposed therebetween and unwinding the multilayer optical film from the roll; a film feeding step including feeding the multilayer optical film being unwound from the roll in the unwinding step; an optical cell feeding step including feeding the optical cell; a peeling step including peeling off the optical film from the carrier film by inwardly folding back the carrier film fed by the film feeding step; and a bonding step including bonding the optical film, which is peeled off from the carrier film in the peeling step, to one side of the optical cell with the pressure-sensitive adhesive interposed therebetween while feeding the optical cell, wherein the longitudinal length (L) of the carrier film between an unwinding position at which the multilayer optical film begins to be unwound in the film feeding step and a peeling position at which peeling is started in the peeling step is 15 times or more the width (W) of the carrier film.

Further the continuous manufacturing method includes: a second unwinding step including providing a second roll of a second multilayer optical film comprising a second optical film having a pressure-sensitive adhesive layer and a second long carrier film placed on the second optical film with the pressure-sensitive adhesive layer interposed therebetween and unwinding the second multilayer optical film from the second roll; a second film feeding step including feeding the second multilayer optical film being unwound from the second roll in the second unwinding step; an optical cell feeding step including feeding the optical cell; a second peeling step including peeling off the second optical film from the second carrier film by inwardly folding back the second carrier film fed by the second film feeding step; and a second bonding step including bonding the second optical film, which is peeled off from the second carrier film in the second peeling step, to another side of the optical cell with the pressure-sensitive adhesive interposed therebetween while feeding the optical cell, wherein the longitudinal length (L) of the second carrier film between an unwinding position at which the second multilayer optical film begins to be unwound in the second film feeding step and a peeling position at which peeling is started in the second peeling step is 15 times or more the width (W) of the second carrier film.

(Other Embodiments)

The above embodiment uses the first and second tension control units 1023 and 2023. The first and second tension control units 1023 and 2023 are not essential elements and may be absent.

The above embodiment uses the first and second cutting units 1021 and 2021. The first and second cutting units 1021 and 2021 are not essential elements and may be absent. In this case, only the carrier film may remain continuous in each of the first and second multilayer optical film, and in other members (including the polarizing film), score lines may be formed in the transverse direction to divide them into pieces of a size corresponding to that of the liquid crystal cell.

In the above embodiment, the first and second bonding units are configured to bond the first and second polarizing films to the liquid crystal cell from the upper side. This is a non-limiting example, and alternatively, one of the films may be bonded to the liquid crystal cell from the upper side, and the other may be bonded to the liquid crystal cell from the lower side, or all films may be bonded to the liquid crystal cell from the lower side.

In the embodiment, both the first and second polarizing films may have an absorption axis perpendicular or parallel to the longitudinal direction of the polarizing film.

In another embodiment, the first polarizing film may have an absorption axis perpendicular to its longitudinal direction, and the second polarizing film may have an absorption axis parallel to its longitudinal direction. Conversely, the second polarizing film may have an absorption axis perpendicular to its longitudinal direction, and the first polarizing film may have an absorption axis parallel to its longitudinal direction. In this case, the orientation changing unit 300 may only have the function of the turnover unit to turn over the liquid crystal cell P upside down without interchanging the directions of the long and short sides.

In another embodiment, the optical cell may be an EL cell including an organic EL cell or an inorganic EL cell, and the multilayer optical film may include a polarizing film having an absorption axis parallel or perpendicular to the longitudinal direction, a retardation film having a slow axis at an angle in the range of 35° to 55° with respect to the absorption axis of the polarizing film and having a retardation in the range of 110 nm to 170 nm at a wavelength of 550 nm, and an adhesive or a pressure-sensitive adhesive, in which the polarizing film, the retardation film, and the adhesive or pressure-sensitive adhesive are arranged in this order.

EXAMPLES

First, material rolls were provided. Different rolls of long polarizing films having different film widths W were provided. Each roll was mounted on the unwinding unit of a rewinding machine, and the polarizing film was drawn and wound into a new roll. In this process, the whole length of the polarizing film was 100 m. The material winding speed was 5 m/minute. During the winding process, the core mounted on the take-up unit was shifted in one direction by 3 cm over 10 seconds and then stopped, and after normal winding for the next 50 seconds, the core was shifted in the opposite direction in the same manner. In this way, a polarizing film roll having displaced windings at intervals of 5 m was prepared.

In the manufacturing system of FIG. 1A, a plurality of free rolls were placed between the cutting unit and the bonding unit to change the length L of the film between the unwinding position at which the material was unwound from the roll and the front end of the peeling means. As a result, feed routes 1 to 6 were formed as shown in FIGS. 2 to 6. In feed route 1, the length L of the film is 10.5 m. In feed route 2, L is 12.5 m, in feed route 3, L is 13.6 m, in feed route 4, L is 8.4 m, in feed route 5, L is 7.6 m, and in feed route 6, L is 6.8 m.

A 1.4 mm thick rectangular glass plate was used as an alternative to a liquid crystal cell. A polarizing film roll prepared with no displacement of windings was used in advance in the manufacturing system of FIG. 1A, in which the polarizing film piece was bonded to each of the liquid crystal cell and the glass plate under the conditions of Example 1 described below, so that it was confirmed that there was no difference in bonding accuracy between the liquid crystal cell and the glass plate.

In the examples described below, the bonding was controlled in such a manner that the cut end of the polarizing film was placed parallel to the short side of the glass plate and the bonding-start end of the polarizing film piece was placed 20 mm apart from an end of the glass plate. The left end of the polarizing film piece on the bonding start side was also placed 20 mm apart from the long-side end of the glass plate.

Example 1

Using the roll of long polarizing film with a width (W) of 65 cm (the roll having displaced windings), a laminate sample was prepared by bonding the polarizing film piece to the glass plate in the manufacturing system of FIG. 1A. The number n of the prepared samples was 50. In the cutting unit, the polarizing film was cut at intervals of 100 cm in the longitudinal direction. The resulting polarizing film piece was bonded to the central part of the glass plate with a length of 102 cm and a width of 67 cm. In this process, the length L of the film in the route was 10.5 m, and L/W was 16.2 (rounded to one decimal place).

Example 2

Figure 2:
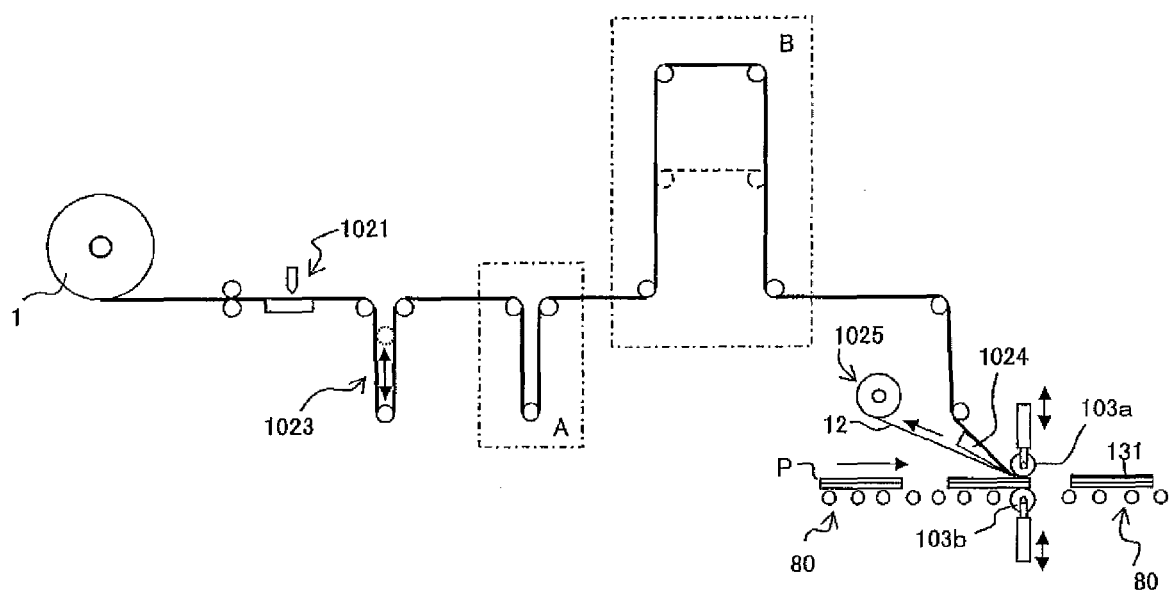
FIG. 2 is a diagram showing an example of a system of another embodiment for manufacturing an optical display panel.

The same procedure as in Example 1 was performed except that the manufacturing system of FIG. 2 was used. The length L of the film in the route was 12.5 m, and L/W was 19.2.

Example 3

Figure 3:
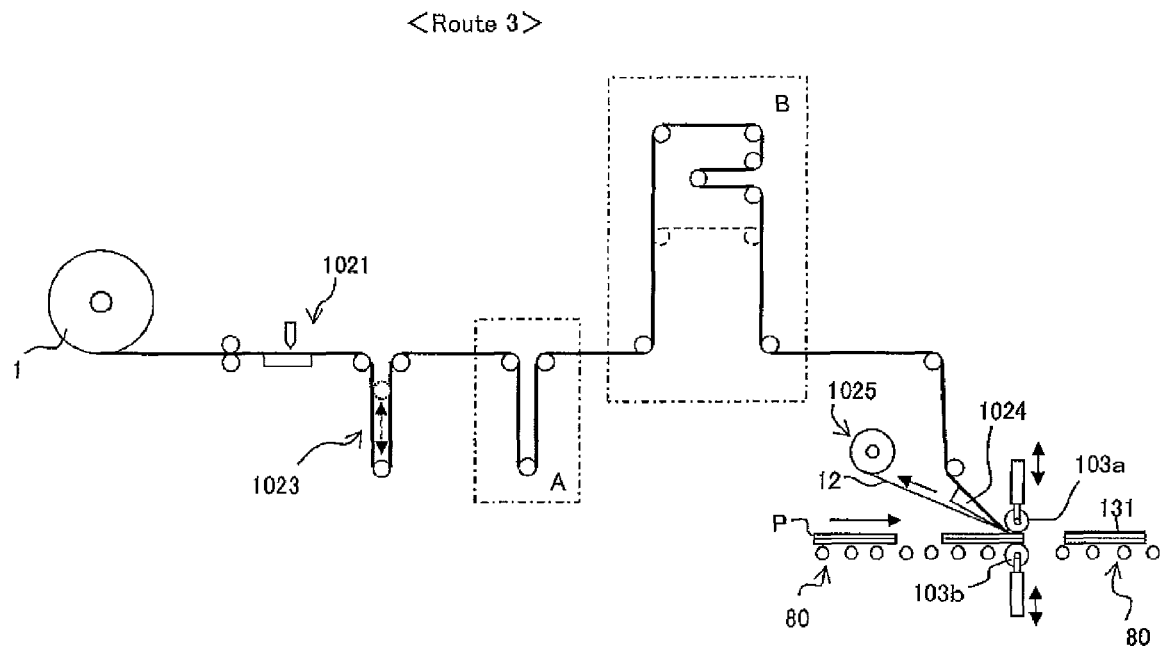
FIG. 3 is a diagram showing an example of a system of another embodiment for manufacturing an optical display panel.

The same procedure as in Example 1 was performed except that the manufacturing system of FIG. 3 was used. The length L of the film in the route was 13.6 m, and L/W was 20.9.

Comparative Example 1

Figure 4:
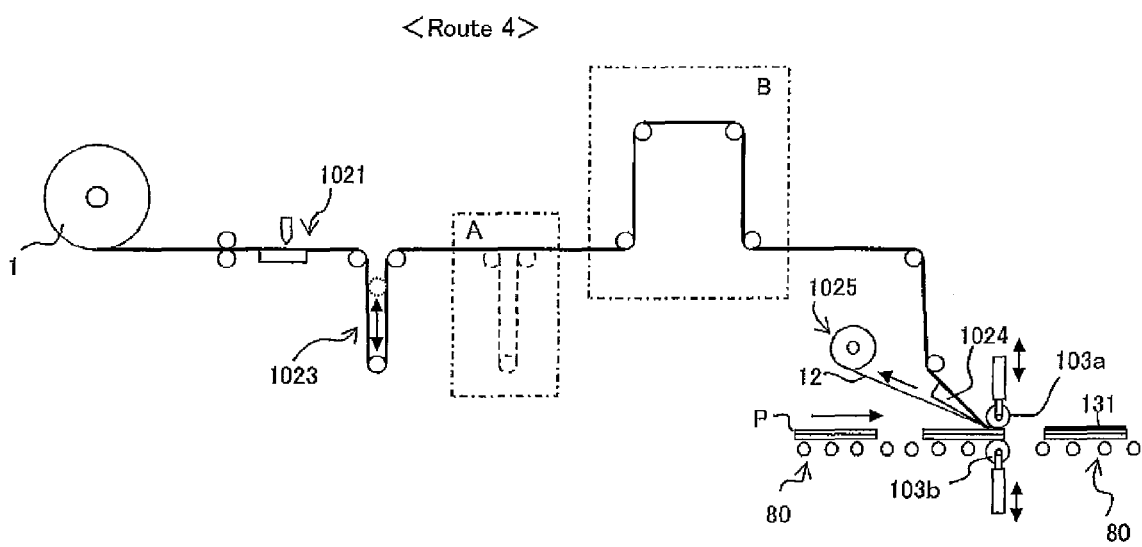
FIG. 4 is a diagram showing an example of a system of another embodiment for manufacturing an optical display panel.

The same procedure as in Example 1 was performed except that the manufacturing system of FIG. 4 was used. The length L of the film in the route was 8.4 m, and L/W was 12.9.

Comparative Example 2

Figure 5:
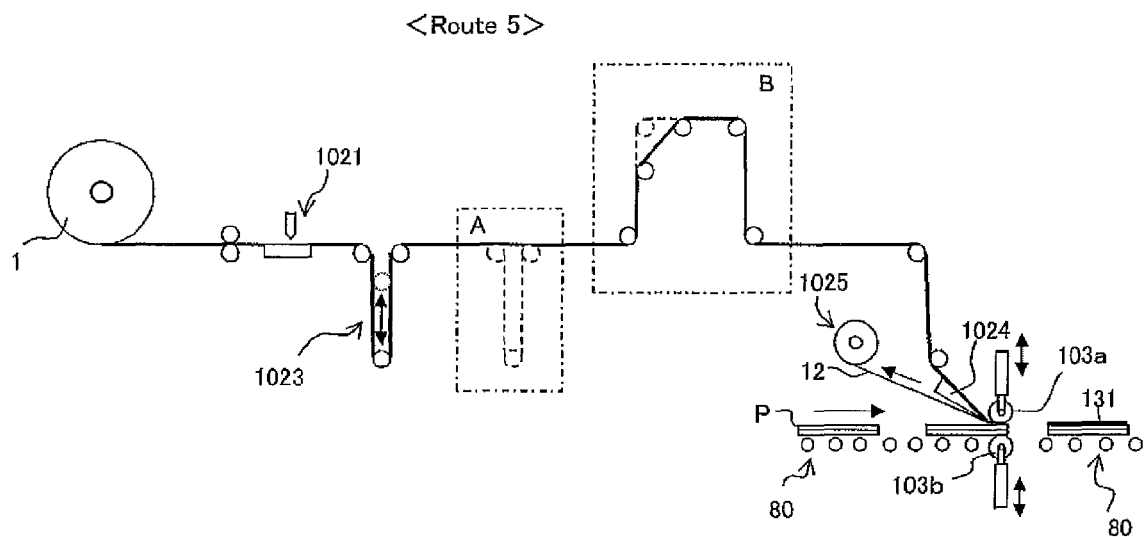
FIG. 5 is a diagram showing an example of a system of another embodiment for manufacturing an optical display panel.

The same procedure as in Example 1 was performed except that the manufacturing system of FIG. 5 was used. The length L of the film in the route was 7.6 m, and L/W was 11.7.

Comparative Example 3

Figure 6:
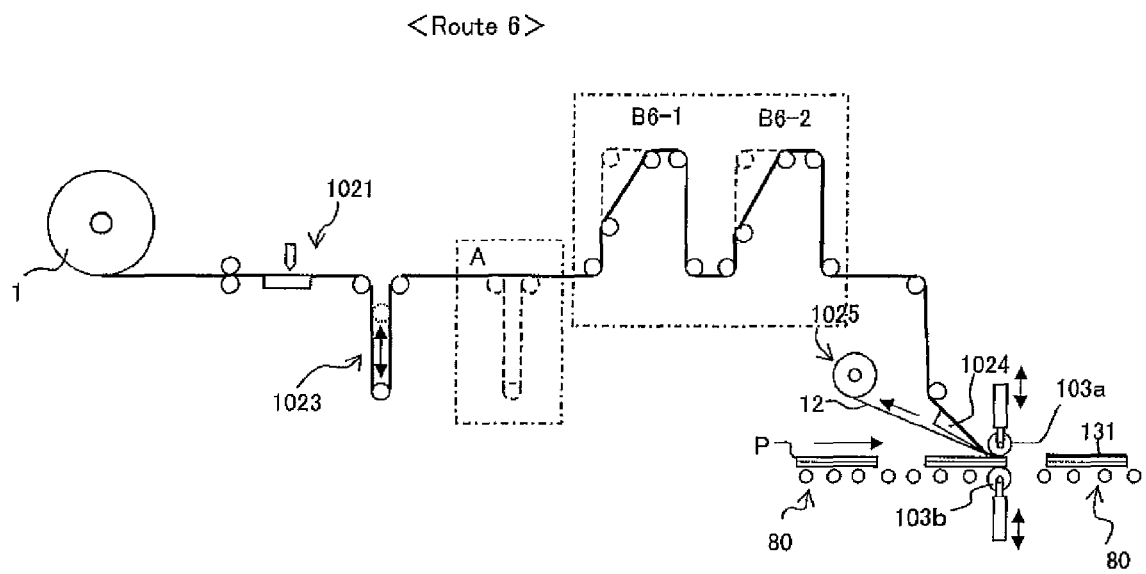
FIG. 6 is a diagram showing an example of a system of another embodiment for manufacturing an optical display panel.

The same procedure as in Example 1 was performed except that the manufacturing system of FIG. 6 was used. The length L of the film in the route was 6.8 m, and L/W was 10.5.

Example 4

Using the roll of long polarizing film with a width (W) of 60 cm (the roll having displaced windings), a laminate sample was prepared by bonding the polarizing film piece to the glass plate in the manufacturing system of FIG. 1A. The number n of the prepared samples was 50. In the cutting unit, the polarizing film was cut at intervals of 100 cm in the longitudinal direction. The resulting polarizing film piece was bonded to the central part of the glass plate with a length of 102 cm and a width of 62 cm. In this process, the length L of the film in the route was 10.5 m, and L/W was 17.5 (rounded to one decimal place).

Example 5

The same procedure as in Example 4 was performed except that the manufacturing system of FIG. 2 was used. The length L of the film in the route was 12.5 m, and L/W was 20.8.

Example 6

The same procedure as in Example 4 was performed except that the manufacturing system of FIG. 3 was used. The length L of the film in the route was 13.6 m, and L/W was 22.7.

Comparative Example 4

The same procedure as in Example 4 was performed except that the manufacturing system of FIG. 4 was used. The length L of the film in the route was 8.4 m, and L/W was 14.

Comparative Example 5

The same procedure as in Example 4 was performed except that the manufacturing system of FIG. 5 was used. The length L of the film in the route was 7.6 m, and L/W was 12.7.

Comparative Example 6

The same procedure as in Example 4 was performed except that the manufacturing system of FIG. 6 was used. The length L of the film in the route was 6.8 m, and L/W was 11.3.

Example 7

Using the roll of long polarizing film with a width (W) of 80 cm (the roll having displaced windings), a laminate sample was prepared by bonding the polarizing film piece to the glass plate in the manufacturing system of FIG. 2. The number n of the prepared samples was 50. In the cutting unit, the polarizing film was cut at intervals of 100 cm in the longitudinal direction. The resulting polarizing film piece was bonded to the central part of the glass plate with a length of 102 cm and a width of 82 cm. In this process, the length L of the film in the route was 12.5 m, and L/W was 15.6 (rounded to one decimal place).

Example 8

The same procedure as in Example 7 was performed except that the manufacturing system of FIG. 3 was used. The length L of the film in the route was 13.6 m, and L/W was 17.

Comparative Example 7

The same procedure as in Example 7 was performed except that the manufacturing system of FIG. 1A was used. The length L of the film in the route was 10.5 m, and L/W was 13.1.

Comparative Example 8

The same procedure as in Example 7 was performed except that the manufacturing system of FIG. 4 was used. The length L of the film in the route was 8.4 m, and L/W was 10.5.

Comparative Example 9

The same procedure as in Example 7 was performed except that the manufacturing system of FIG. 5 was used. The length L of the film in the route was 7.6 m, and L/W was 9.5.

Comparative Example 10

The same procedure as in Example 7 was performed except that the manufacturing system of FIG. 6 was used. The length L of the film in the route was 6.8 m, and L/W was 8.5.

(Measurement and Evaluation)

The position of the bonding end of the polarizing film piece from the long side of the glass plate was measured for the 50 samples each having the bonded polarizing film piece. Subsequently, 20 mm was subtracted from each of the measurements, and the standard deviation of the resulting values was calculated. In addition, 20 mm was subtracted from each measured distance between the bonding end of the polarizing film piece and the long side of the glass plate, and the maximum of the absolute values of the results was determined as the maximum misalignment. Visual observation was also performed to determine the presence or absence of a wrinkle caused by the bonding of the polarizing film piece. It was determined how many samples had a wrinkle, out of the 50 samples each having the bonded polarizing film piece. Table 1 shows the results.

TABLE 1

| | | | | Film bonding misalignment (mm) | | |
|---|---|---|---|---|---|---|
| | L (m) | W (cm) | L/W | Maximum misalignment | Standard deviation | Number of wrinkled samples |
| Example 1 | 10.5 | 65 | 16.2 | 0.7 | 0.37 | 0 |
| Example 2 | 12.5 | 65 | 19.2 | 0.4 | 0.24 | 0 |
| Example 3 | 13.6 | 65 | 20.9 | 0.3 | 0.18 | 0 |
| Example 4 | 10.5 | 60 | 17.5 | 0.6 | 0.33 | 0 |
| Example 5 | 12.5 | 60 | 20.8 | 0.4 | 0.22 | 0 |
| Example 6 | 13.6 | 60 | 22.7 | 0.3 | 0.17 | 0 |
| Example 7 | 12.5 | 80 | 15.6 | 0.7 | 0.41 | 0 |
| Example 8 | 13.6 | 80 | 17.0 | 0.7 | 0.35 | 0 |
| Comparative Example 1 | 8.4 | 65 | 12.9 | 1.2 | 0.57 | 4 |
| Comparative Example 2 | 7.6 | 65 | 11.7 | 1.4 | 0.76 | 5 |
| Comparative Example 3 | 6.8 | 65 | 10.5 | 1.7 | 0.93 | 8 |
| Comparative Example 4 | 8.4 | 60 | 14.0 | 0.9 | 0.48 | 2 |
| Comparative Example 5 | 7.6 | 60 | 12.7 | 1.3 | 0.71 | 4 |
| Comparative Example 6 | 6.8 | 60 | 11.3 | 1.3 | 0.75 | 6 |
| Comparative Example 7 | 10.5 | 80 | 13.1 | 1.0 | 0.53 | 6 |
| Comparative Example 8 | 8.4 | 80 | 10.5 | 2.0 | 0.98 | 8 |
| Comparative Example 9 | 7.6 | 80 | 9.5 | 1.9 | 1.07 | 9 |
| Comparative Example 10 | 6.8 | 80 | 8.5 | 2.4 | 1.23 | 9 |

The results in Table 1 show that the amount of the bonding misalignment was small and no wrinkling was observed in Examples 1 to 8 where L/W was at least 15 (15 or more) as compared with the results in Comparative Examples 1 to 10 where L/W was not at least 15. Thus it has been demonstrated that even when a roll having displaced windings is used, an optical film can be successfully bonded to an optical cell under manufacturing conditions where L/W is 15 or more.

What is claimed is:

1. A method for manufacturing an optical display panel comprising an optical cell and a pressure-sensitive adhesive layer-carrying optical film provided on the optical cell with the pressure-sensitive adhesive layer interposed therebetween, the method comprising:
   an unwinding step comprising providing a roll of a multilayer optical film comprising the optical film and a long carrier film placed on the optical film with the pressure-sensitive adhesive layer interposed therebetween and unwinding the multilayer optical film from the roll;
   a film feeding step comprising feeding the multilayer optical film being unwound from the roll in the unwinding step;
   an optical cell feeding step comprising feeding the optical cell;
   a peeling step comprising peeling off the optical film from the carrier film by inwardly folding back the carrier film fed by the film feeding step; and
   a bonding step comprising bonding the optical film, which is peeled off from the carrier film in the peeling step, to one side of the optical cell with the pressure-sensitive adhesive interposed therebetween while feeding the optical cell, wherein
   the longitudinal length (L) of the carrier film between an unwinding position at which the multilayer optical film begins to be unwound in the film feeding step and a peeling position at which peeling is started in the peeling step is 15 times or more the width (W) of the carrier film.

2. The method according to claim 1, further comprising:
   a second unwinding step comprising providing a second roll of a second multilayer optical film comprising a second optical film having a pressure-sensitive adhesive layer and a second long carrier film placed on the second optical film with the pressure-sensitive adhesive layer interposed therebetween and unwinding the second multilayer optical film from the second roll;
   a second film feeding step comprising feeding the second multilayer optical film being unwound from the second roll in the second unwinding step;
   an optical cell feeding step comprising feeding the optical cell;
   a second peeling step comprising peeling off the second optical film from the second carrier film by inwardly folding back the second carrier film fed by the second film feeding step; and
   a second bonding step comprising bonding the second optical film, which is peeled off from the second carrier film in the second peeling step, to another side of the optical cell with the pressure-sensitive adhesive interposed therebetween while feeding the optical cell, wherein
   the longitudinal length (L) of the second carrier film between an unwinding position at which the second multilayer optical film begins to be unwound in the second film feeding step and a peeling position at which peeling is started in the second peeling step is 15 times or more the width (W) of the second carrier film.

3. The method according to claim 2, wherein the optical film is a polarizing film.

4. The method according to claim 3, wherein the polarizing film has an absorption axis in a direction perpendicular to its longitudinal direction.

5. The method according to claim 3, wherein the polarizing film has an absorption axis in a direction parallel to its longitudinal direction.

6. The method according to claim 1, wherein the optical film is a polarizing film.

7. The method according to claim 6, wherein the polarizing film has an absorption axis in a direction perpendicular to its longitudinal direction.

8. The method according to claim 6, wherein the polarizing film has an absorption axis in a direction parallel to its longitudinal direction.

9. The method according to claim 1, wherein the optical cell is an electroluminescent cell comprising an organic electroluminescent cell or an inorganic electroluminescent cell, and the multilayer optical film comprises a polarizing film having an absorption axis parallel or perpendicular to its longitudinal direction, a retardation film having a slow axis at an angle in the range of 35° to 55° with respect to the absorption axis of the polarizing film and having a retardation in the range of 110 nm to 170 nm at a wavelength of 550 nm, and an adhesive or a pressure-sensitive adhesive, wherein the polarizing film, the retardation film, and the adhesive or pressure-sensitive adhesive are arranged in this order.

* * * * *